United States Patent
Heinz et al.

(10) Patent No.: US 6,940,213 B1
(45) Date of Patent: Sep. 6, 2005

(54) PIEZOELECTRIC ACTUATOR

(75) Inventors: Rudolf Heinz, Renningen (DE); Friedrich Boecking, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/674,771

(22) PCT Filed: Feb. 24, 2000

(86) PCT No.: PCT/DE00/00511
§ 371 (c)(1),
(2), (4) Date: Dec. 29, 2000

(87) PCT Pub. No.: WO00/52770
PCT Pub. Date: Sep. 8, 2000

(30) Foreign Application Priority Data
Mar. 4, 1999 (DE) .......................... 199 09 482

(51) Int. Cl.[7] .............................................. H01L 41/08
(52) U.S. Cl. ........................ 310/366; 310/328; 310/369
(58) Field of Search ................................ 310/328, 366, 310/369

(56) References Cited

U.S. PATENT DOCUMENTS

| | | | | |
|---|---|---|---|---|
| 3,281,613 A | * | 10/1966 | Hatschek | 310/328 X |
| 3,390,287 A | * | 6/1968 | Sondergger | 310/328 |
| 3,521,090 A | * | 7/1970 | Angeloff | 310/328 |
| 4,471,256 A | * | 9/1984 | Igashira et al. | 310/328 |
| 4,523,121 A | * | 6/1985 | Takahashi et al. | 310/328 |
| 4,667,127 A | * | 5/1987 | Krempl et al. | 310/338 |
| 4,759,107 A | * | 7/1988 | Ogawa et al. | 310/328 |
| 5,055,734 A | * | 10/1991 | Grawey et al. | 310/366 |
| 5,153,477 A | * | 10/1992 | Jomura et al. | 310/328 |
| 5,225,731 A | * | 7/1993 | Owen | 310/366 |
| 5,568,579 A | | 10/1996 | Okaniwa | |
| 5,568,679 A | * | 10/1996 | Ohya et al. | 29/25.35 |
| 5,770,916 A | * | 6/1998 | Ezaki et al. | 310/328 X |
| 6,046,526 A | * | 4/2000 | Maruyama | 310/323.06 |
| 6,114,798 A | * | 9/2000 | Maruyama et al. | 310/328 |

FOREIGN PATENT DOCUMENTS

| | | |
|---|---|---|
| DE | 34 12 014 C1 | 10/1985 |
| DE | 196 26 671 C1 | 10/1997 |
| DE | 197 12 923 A1 | 10/1998 |
| FR | 2 702 895 | 9/1994 |
| GB | 1 453 978 | 10/1976 |
| JP | 6-64212 | 3/1994 |
| JP | 08-306979 | * 11/1996 |
| JP | 1-1317552 | 11/1999 |
| JP | 2000-236120 | * 8/2000 |

\* cited by examiner

Primary Examiner—Mark Budd
(74) Attorney, Agent, or Firm—Ronald E. Greigg

(57) ABSTRACT

The invention relates to a piezoelectric actuator, in particular for actuating control valves or injection valves of internal combustion engines in motor vehicles, having a circular, cylindrical piezoelectric actuator body in the form of a multilayered laminate made up of stacked layers of piezoelectric material with intervening metallic or electrically conductive, alternating first and second electrode layers that function as electrodes, wherein these first and second electrode layers alternatingly contact a first and second electrically conductive common electrode connection. Either the piezoelectric actuator body has either an internal longitudinal bore and at least the first common electrode connection is provided on the inner wall of the actuator body constituted by the internal longitudinal bore and contacts every first electrode layer there or alternatively, the actuator body has no internal bore and the first and second electrode layers are respectively exposed on the outer cylinder wall of the actuator body at points angularly offset from one another and respectively contact the first and second electrode connections there.

6 Claims, 2 Drawing Sheets

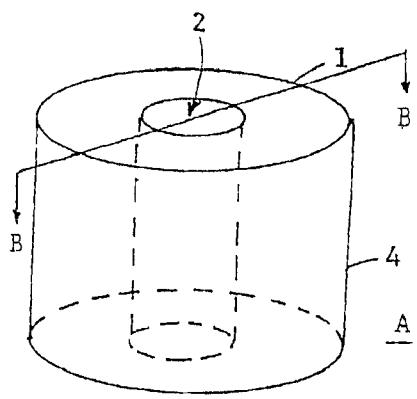
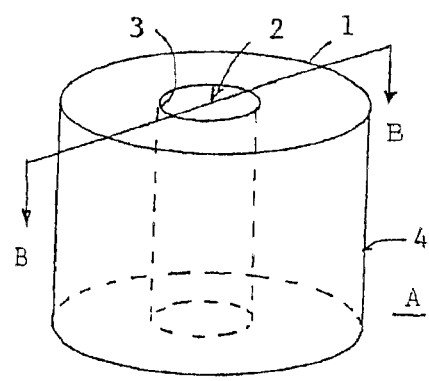
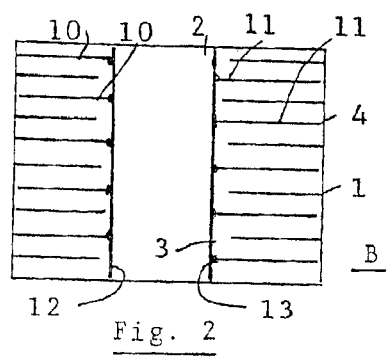
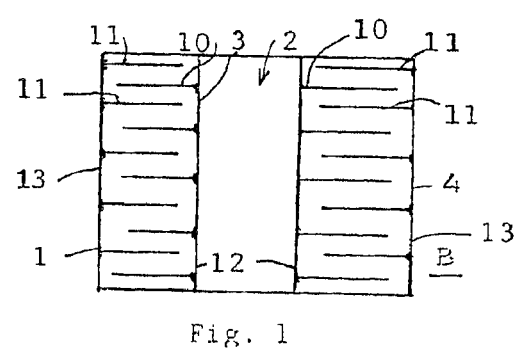
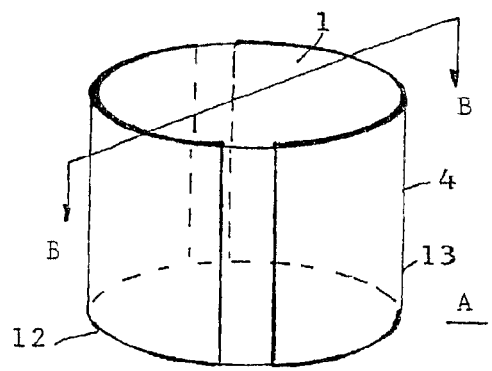
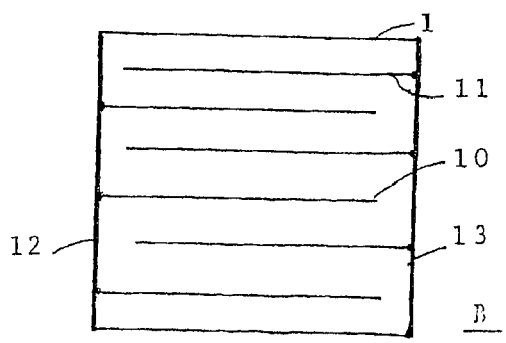

PIEZOELECTRIC ACTUATOR

CROSS-REFERENCES TO RELATED APPLICATIONS

This is a 35 USC 371 application of PCT/DE 00/00511 filed on Feb. 24, 2000.

BACKGROUND OF THE INVENTION

1. Field of the Invention

This invention relates to a piezoelectric actuators, and more particular for actuating control valves or injection valves of internal combustion engines in motor vehicles, and having a circular, cylindrical piezoelectric actuator body in the form of a multilayered laminate made up of stacked layers of piezoelectric material with intervening metallic or electrically conductive, alternating first and second electrode layers that function as electrodes, wherein these first and second electrode layers alternatingly contact a first and second electrically conductive common electrode connection.

2. Description of the Prior Art

Generally, high-voltage piezoelectric actuators that are cylindrical in shape are known which, as individual disks with fixed electrodes, are stacked into a cylinder (e.g. see U.S. Pat. No. 4,460,842). For the external electrode connections, electrode plates are routed to the circumference of the cylindrical stack and are bent at right angles there so that strip-shaped electrode connections that are angularly offset from one another can contact the respective electrodes that are associated with one another.

For the use of a piezoelectric actuator for actuating injection valves in internal combustion engines of motor vehicles, a cylindrical actuator is advantageous since it optimally utilizes the available installation space in an injector body and in a circular bore in the cylinder head of the engine. Then a high-pressure bore can also be routed in the injector body or housing next to the actuator.

The circular contour of the actuator body requires a special electrode structure in order to be able to embody an electrically and mechanically favorable contacting of the electrodes with associated electrode connections.

SUMMARY OF THE INVENTION

In accordance with the above, the object of the invention is to produce a piezoelectric actuator that is particularly suited for actuating control valves or injection valves of internal combustion engines in motor vehicles, having a circular, cylindrical piezoelectric actuator body in the form of a multilayered laminate made up of stacked layers of piezoelectric material with intervening metallic or electrically conductive, alternating first and second electrode layers that function as electrodes, so that a mechanically stable, space-saving, and electrically reliable contacting of the electrode layers with the associated electrode connections is possible.

The attainment of the above object can be made up of two aspects according to the invention:

In the first aspect according to the invention, the circular, cylindrical actuator body has an internal bore, wherein the first electrode connections are disposed on the inside and the second electrode connections are affixed externally or also, both electrode connections are accommodated in the internal bore.

According to the second aspect of the invention, the actuator body is likewise circular and cylindrical, but does not have an internal bore. The electrode connections are disposed on the circumference of the cylindrical actuator body and are angularly offset in relation to one another, wherein the first and second electrode layers also have respective recesses which insulatingly encompass the electrode connection that is not in contact with this electrode layer.

In this manner, an advantageous piezoelectric actuator can be produced, whose outer contour—despite the electrode connections—diverges little or not at all from the circular, cylindrical form so that a piezoelectric actuator of this kind can be snugly fitted into a circular, cylindrical bore of an injector body, wherein there is still space for a high-pressure bore in the wall of the injector body.

BRIEF DESCRIPTION OF THE DRAWINGS

The above-mentioned features of the invention and others will be discussed in more detail in the description below, taken in conjunction with the drawings, in which:

FIGS. 1A & 1B respectively show perspective and longitudinal sectional views of a piezoelectric actuator embodied according to the first aspect of the invention.

FIGS. 2A & 2B respectively show perspective and longitudinal sectional views of a variant of a piezoelectric actuator according to the invention embodied in accordance with the first aspect.

FIGS. 3A & 3B respectively show perspective and longitudinal sectional views of a piezoelectric actuator embodied in accordance with the second aspect according to the invention.

DESCRIPTION OF THE PREFERRED EMBODIMENTS

Figure 4:
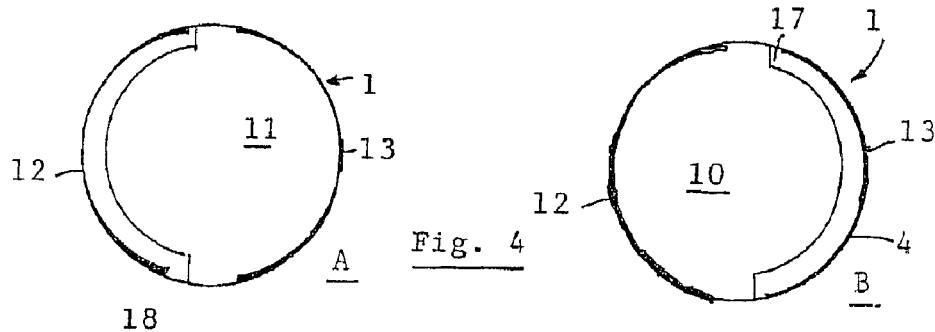
FIGS. 4 to 8 show cross sections of variants of the exemplary embodiment of a piezoelectric actuator depicted in FIGS. 3A and 3B.

FIG. 1A shows a circular, cylindrical actuator body 1, which is provided with a central, internal longitudinal bore 2.

According to FIG. 1B, first electrode layers 10, which alternate with second electrode layers 11 in the piezoelectric actuator body 1, are exposed on the inner wall 3 of the actuator body 1 that is constituted by the central, internal longitudinal bore 2 and contact a first common electrode connection 12 there, while the second electrically conductive electrode layers 11 are exposed on the outer cylinder wall 4 of the actuator body 1 and contact a second common electrode connection 13 there. In this manner, the first common electrode connection 12 is disposed on the inside and second common electrode connection 13 is disposed on the outside of the actuator body 1. In the cross section through the actuator body 1 shown in FIG. 1B, it is also clear that the first electrode layers 10 that contact the first electrode connection 12 do not extend to the outer cylinder wall 4 and that the second electrode layers 11 that contact the second common electrode connection 13 do not reach the inner wall 3 of the actuator body 1 constituted by the bore 2.

In principle, the first common electrode connection 12 covers the entire inner wall 3 of the actuator body 1 in a circular fashion and the second common electrode connection 13 covers the entire outer wall 4 in a circular fashion. Alternatively, the first and second electrode connection 12 and 13 can also be routed only in the form of a strip parallel to the longitudinal axis of the actuator body 1.

The variant of the piezoelectric actuator embodied in accordance with the first aspect according to the invention shown in FIGS. 2A and 2B differs from the first embodiment shown in FIGS. 1A and 1B in that none of the first and second electrode layers 10 and 11 are exposed on the outer cylinder wall 4 of the actuator body 1, but instead contact the first and second common electrode connection 12 and 13 exclusively on the inner wall 3 that is constituted by the internal longitudinal bore 2.

The first and second common electrode connections 12 and 13 constitute narrow contact strips which are disposed on the inner wall 3 of the actuator body 1 and are aligned in its longitudinal direction.

The advantage of the exemplary embodiment of the piezoelectric actuator according to the invention shown in FIGS. 2A and 2B lies in the high degree of utilization of the active piezoelectric surfaces.

In contrast, the advantage of the exemplary embodiment of a piezoelectric actuator according to the invention shown in FIGS. 1A and 1B is that a prestressing element, e.g. in the form of a metallic pin, can be inserted through the internal bore 2 in order to exert a mechanical initial stress on the two end faces of the actuator body 1. As a result, tension brackets that are guided along the outside of the actuator body 1 can be eliminated.

A piezoelectric actuator embodied in accordance with the second aspect of the invention, as shown in FIGS. 3A and 3B, has no internal bore. The alternating first and second electrode layers 10 and 11 are respectively exposed on opposite circumferential sides of the circular, cylindrical actuator body 1 and contact the first and second electrode connections 12, 13 on these opposite circumferential sides. The perspective depiction in FIG. 3A shows that the contact surfaces available for the first and second electrode connections 12, 13 can, in principle, extend to almost 180° around the circumferential surface of the cylinder. The first and second electrode connections 12, 13 then each constitute a shell on the cylinder circumference surface. So that the first and second electrode connections 12, 13 are insulated from one another, two diametrically opposed strips remain untouched by electrode connections.

The sectional view depicted in FIGS. 4A and 4B shows one such variant with wide contact surfaces for the first and second common electrode connections 12 and 13. According to FIG. 4B, each first electrode layer 10 is recessed around the shell-shaped second electrode connection 13, wherein this recess 17 is comprised of ceramic without electrode material. In precisely same manner, every second electrode layer 11 is recessed around the first common electrode connection 12 so that the first electrode layer 12 is insulated in relation to the second electrode layer 11. This recess 18 is also comprised of ceramic without electrode material. According to FIGS. 4A and 4B, the form of the recesses 17 and 18 is arc-shaped, wherein the arc of the first and second recesses encloses a slightly greater angular range than the shell of the second and first electrode connections.

In principle, the electrode surface area of a piezoelectric actuator is better utilized the smaller the contact surfaces of the first and second common electrode connections become. One embodiment for this is shown in FIGS. 5A, 5B, 6, and 7. The first and second electrode connections 12 and 13 constitute narrow, diametrically opposed contact strips which are aligned in the longitudinal direction on the outer circumference 4 of the piezoelectric actuator body 1. The respective recesses 17 and 18 can therefore be small so that they take only small parts of the surface area away from the respective electrode surfaces of the first and second electrode layers 10 and 11.

Figure 5:
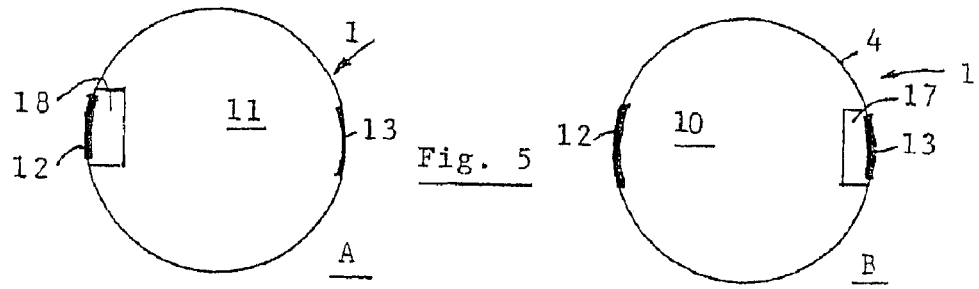
Figure 6:
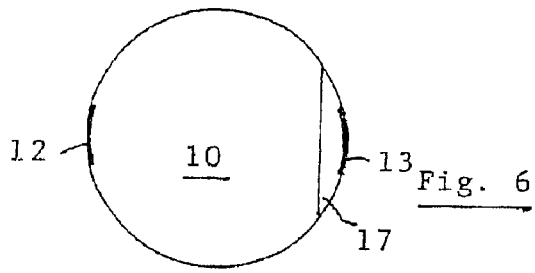
Figure 7:
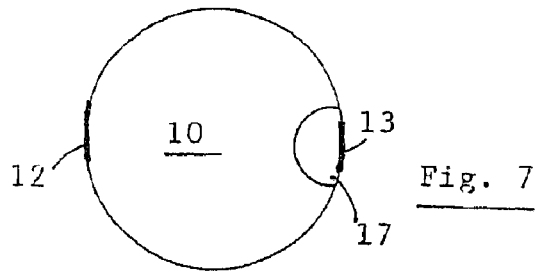
Figure 8:
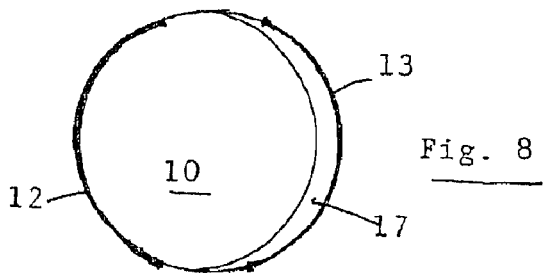

In contrast to FIGS. 4 and 5, the variants according to FIGS. 6 to 8 show only a side view, wherein only one of the electrode layers, e.g. one of the first electrode layers 10 and the recess 17 encompassing the contact strip of the second electrode connection 13, can be seen. According to FIGS. 6 and 7, the recesses 17 are limited to small parts of the service area of the first electrode layers 10. The recesses 18 (not shown) are then formed in precisely same manner around the contact strip constituting the first common electrode connection 12.

According to FIG. 6, the recesses 17 and 18 have the form of a segment of a circle. According to FIG. 7, the recesses 17 and 18 have the form of an arc-shaped section respectively cut from the first and second electrode layer.

In contrast to those in FIGS. 5 to 7, the first and second common electrode connections 12 and 13 in FIG. 8 are embodied similarly to those in FIG. 4, in the form of wide shells and each recess 17 of the first electrode layer is disposed approximately in the form of a crescent around the second electrode layer 13. The second recess 18 of the second electrode layers 11 (not shown in FIG. 8) then has the same form around the first electrode connection 12.

Particular to all of the exemplary embodiments shown in FIG. 3 to 8 is an offset disposition of the first and second electrode layers 10 and 11 according to FIG. 3B, wherein the first and second electrode layers 10 and 11 are each exposed on diametrically opposite sides of the cylinder circumference surface and maintain contact there with narrow contact strips of the first and second common electrode connections 12, 13 (see FIGS. 5, 6, and 7) or with wider contact shells of the first and second common electrode connections 12 and 13 (FIGS. 4 and 8). The outer contours of the exemplary embodiments of a piezoelectric actuator according to the invention shown in the Figs. diverge hardly or not all from the circular, cylindrical form that is optimal for the intended use indicated.

The foregoing relates to preferred exemplary embodiments of the invention, it being understood that other variants and embodiments thereof are possible within the spirit and scope of the invention, the latter being defined by the appended claims.

We claim:

1. A piezoelectric actuator for actuating control valves or injection valves of internal combustion engines in motor vehicles, comprising a circular, cylindrical piezoelectric actuator body (1) in the form of a multilayered laminate made up of stacked layers of piezoelectric material with intervening metallic or electrically conductive, alternating first and second electrode layers (10, 11) that function as electrodes, wherein these first and second electrode layers (10, 11) alternatingly contact first and second electrically conductive common electrode connections (12, 13), said first and second electrode layers (10, 11) respectively include portions which are disposed only on the outer cylinder wall (4) of the actuator body (1), and at points that are angularly offset from one another, and each portion from each of the first and second electrode layers contacts the first and second electrode connections (12, 13), wherein each first electrode layer (10) has a recess (17) which encompasses and insulates the second electrode connection (13), wherein each of the first and second electrode connections (12, 13) constitutes a contact surface in the form of a section of a cylinder circumference extending at least 90° in the circumferential direction, and also extending in the longitudinal direction of the actuator body (1).

2. The piezoelectric actuator according to claim 1, wherein the points of the first and second electrode layers and the first and second electrode connections (12, 13) in contact with them, which are exposed on the outer cylinder wall (4) of the actuator body (1), are disposed diametrically opposite one another.

3. The piezoelectric actuator according to claim 2, wherein each second electrode layer (11) has a recess (18) which encompasses and insulates the first electrode connection (12).

4. A piezoelectric actuator for actuating control valves or injection valves of internal combustion engines in motor vehicles, comprising a circular, cylindrical piezoelectric actuator body (1) in the form of a multilayered laminate made up of stacked layers of piezoelectric material with intervening metallic or electrically conductive, alternating first and second electrode layers (10, 11) that function as electrodes, wherein these first and second electrode layers (10, 11) alternatingly contact first and second electrically conductive common electrode connections (12, 13), said first and second electrode layers (10, 11) respectively include portions which are disposed on the outer cylinder wall (4) of the actuator body (1) at points that are angularly offset from one another, and wherein the portions are not disposed on the opposite surface of the piezoelectric elements, and each portion from each of the first and second electrode layers contacts the first and second electrode connections (12, 13), wherein each first electrode layer (10) has a recess (17) which encompasses and insulates the second electrode connection (13), wherein each of the first and second electrode connections (12, 13) constitutes a contact surface in the form of a section of a cylinder circumference extending at least 90° in the circumferential direction, and also extending in the longitudinal direction of the actuator body (1).

5. The piezoelectric actuator according to claim 4, wherein the points of the first and second electrode layers and the first and second electrode connections (12, 13) in contact with them, which are exposed on the outer cylinder wall (4) of the actuator body (1), are disposed diametrically opposite one another.

6. The piezoelectric actuator according to claim 5, wherein each second electrode layer (11) has a recess (18) which encompasses and insulates the first electrode connection (12).

* * * * *